United States Patent [19]

Wharton et al.

[11] Patent Number: 4,677,350

[45] Date of Patent: Jun. 30, 1987

[54] RASTER WIDTH CORRECTION APPARATUS FOR MULTI SCAN FREQUENCY MONITORS

[75] Inventors: James H. Wharton; Lawrence E. Smith, both of Indianapolis, Ind.

[73] Assignee: RCA Corporation, Princeton, N.J.

[21] Appl. No.: 897,647

[22] Filed: Aug. 18, 1986

[51] Int. Cl.[4] ............................................ H01J 29/56
[52] U.S. Cl. ................................................... 315/371
[58] Field of Search ................................ 315/371, 408

[56] References Cited

U.S. PATENT DOCUMENTS

| | | | |
|---|---|---|---|
| 4,329,729 | 5/1982 | Knight | 361/91 |
| 4,565,949 | 1/1986 | Haferl | 315/371 |
| 4,625,154 | 11/1986 | Willis | 315/371 |

*Primary Examiner*—Theodore M. Blum

*Attorney, Agent, or Firm*—Eugene M. Whitacre; Joseph J. Laks; Sammy S. Henig

[57] ABSTRACT

In a deflection circuit that operates in any scan frequency selected from a plurality of frequencies, the supply voltage that is DC-coupled to a first terminal of a trace capacitor is increased when the scan frequency increases. The deflection circuit includes a diode modulator that is controlled by a modulation voltage having an AC component voltage that varies at a vertical rate. The increase in the supply voltage causes an increase in a DC component voltage of the modulation voltage that is coupled to a second terminal of the trace capacitor such that the voltage in the trace capacitor increases in the same proportion as the supply voltage. The proportional increase in the trace capacitor voltage maintains the raster width unchanged when the scan frequency increases.

21 Claims, 1 Drawing Figure

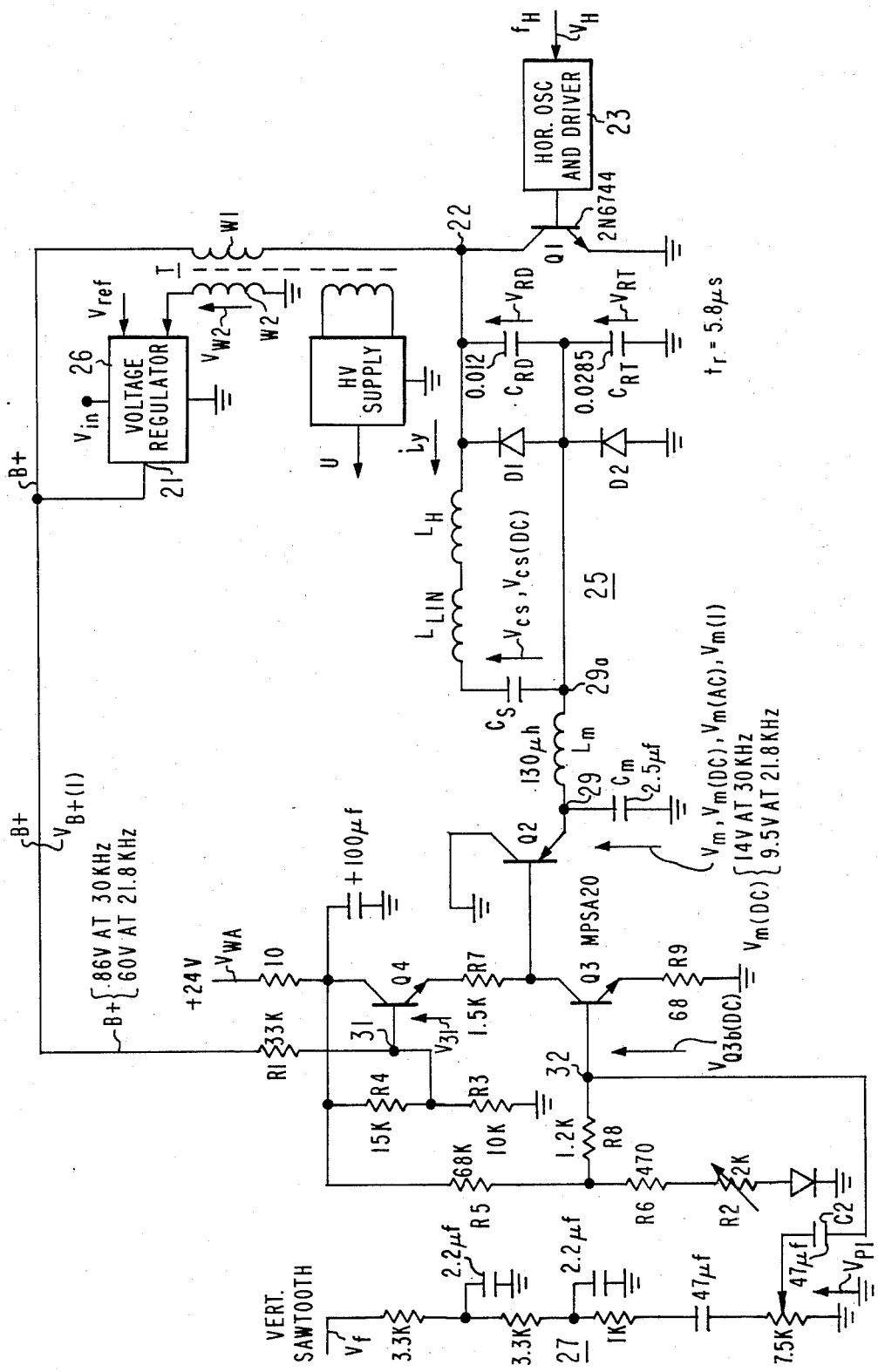

RASTER WIDTH CORRECTION APPARATUS FOR MULTI SCAN FREQUENCY MONITORS

The invention relates to a deflection apparatus that operates at any one scan frequency that is selected from a plurality of frequencies.

In some monitor display applications a horizontal deflection circuit output stage is required to generate a deflection current in a deflection winding at a scan frequency selected from a plurality of scan frequencies. In order to obtain the same amplitude of deflection current, or raster width, at each of such scan frequencies that is selected, a B+ supply voltage that is, for example, coupled to the output stage via a primary winding of a flyback transformer is, for example, increased when the scan frequency increases.

The increase in B+ voltage may be obtained by employing, for example, a frequency-to-voltage converter that increases B+ voltage when the scan frequency increases. Alternatively, the increase in B+ voltage may be obtained using a voltage regulator that controls, using a feedback loop, the level of B+ voltage. Such regulator receives from the output stage a feed-back signal that is representative of the amplitude of the deflection current. The regulator causes B+ voltage to be at a level that maintains the deflection current representative voltage the same at any selected frequency so as to control the amplitude of the deflection current.

It may be desirable to obtain the deflection current representative voltage for regulating the deflection current from a secondary winding of the flyback transformer because of the simplicity of such arrangement and because, by controlling the voltage in the secondary winding, an ultor voltage, that may be produced by a tertiary winding of the flyback transformer, is also regulated.

It may also be desirable to include in the output stage an East-West modulation circuitry such as a diode modulator that modulates the deflection current in an East-West manner to provide pincushion distortion correction.

In a typical diode modulator that includes a switch operating at a deflection rate and that provides East-West correction, the amplitude of the deflection current is controlled by a trace voltage that is developed in a trace capacitor. The trace capacitor is coupled, during trace, in parallel with the deflection winding. A first deflection retrace capacitor and a second, modulator retrace capacitor form a series arrangement that is coupled across the switch. A retrace voltage in the deflection retrace capacitor, that is coupled across the deflection winding, during retrace, is indicative of the amplitude of the deflection current. A parabolic modulation voltage that provides East-West correction, and containing a DC component voltage that provides raster width control, is coupled via a modulation inductance to the output stage at a junction terminal between the two retrace capacitors. The DC voltage across the trace capacitor that controls the raster width is equal to the difference between B+ voltage and the DC component voltage of the modulation voltage. B+ Voltage is coupled to the output stage via a primary winding of a flyback transformer. The retrace voltage in a secondary winding is indicative of the sum of the retrace voltages in the first and second retrace capacitors.

Assume that such diode modulator is coupled in a closed-loop circuit configuration, in which a voltage regulator is used for controlling B+ voltage. Also assume that the retrace voltage in the secondary winding of the flyback transformer is used by the regulator for sensing the deflection current amplitude at each scan frequency. Additionally, assume, hypothetically, that a change in B+ voltage that resulted from a change in the scan frequency, does not affect the DC component voltage of the modulation voltage. The voltage in the secondary winding is indicative of the sum of the retrace voltages in the first and second retrace capacitors. It may be shown, in this hypothetical case, that even though the amplitude of the voltage in the secondary winding is maintained the same by the regulator at different scan frequencies, the ratio between the retrace voltage in the deflection retrace capacitor to that in the modulator retrace capacitor may incorrectly change when the scan frequency and the B+ voltage change. It follows that a given amplitude of the retrace voltage in the secondary winding, even though maintained the same at each scan frequency, does not represent the same amplitude of the retrace voltage in the deflection retrace capacitor. Because the amplitude of the deflection current corresponds with the retrace voltage in the deflection retrace capacitor, the amplitude of the deflection current, disadvantageously, may not be maintained the same as the scan frequency changes. As a result, the raster width may, disadvantageously, change when the scan frequency changes.

In accordance with an aspect of the invention, a deflection apparatus for generating a deflection current in a deflection winding is capable of generating the deflection current at any frequency selected from a plurality of frequencies such that the width of a raster formed by the deflection current is maintained unchanged at the selected frequency. The deflection apparatus includes a source of an input signal at a frequency that is related to the selected frequency and a source of a supply voltage. The supply voltage is varied to have a level that is different at correspondingly different selected scan frequencies. First and second retrace capacitances coupled in series across a pair of main current conducting terminals of a switch develop corresponding first and second retrace voltages. A modulation inductance has a terminal that is coupled at a junction between the first and second retrace capacitances. A source of modulation voltage is coupled via the modulation inductance to the terminal of the inductance to provide East-West pincushion correction. A correction voltage representative of the level of the supply voltage is coupled via the modulation inductance to the terminal of the inductance to maintain the raster width the same at each of the different selected frequencies.

The sole FIGURE illustrates a deflection circuitry that maintains the raster width substantially constant at different scan frequencies.

In the FIGURE, a regulator 26 generates a regulated B+ voltage that is a direct current voltage, developed between a terminal 21 and ground. Terminal 21 is coupled to a first terminal of a winding W1 of a horizontal output transformer T of a deflection circuit output stage 25. The other terminal of winding W1 is coupled to a junction terminal 22.

A horizontal output transistor Q1 has its collector to emitter path coupled between terminal 22 and ground. Transistor Q1 operates, as a switch, at a horizontal rate $f_H$, as controlled by a driver 23. Paralleling transistor Q1 is the series arrangement of two rectifiers, diodes D1 and D2. Coupled between the anode and cathode electrodes of diode D1 is the arrangement of a horizontal deflection winding $L_H$, a linearity correction inductor $L_{LIN}$ and an S-shaping or trace capacitor $C_s$. A first, deflection retrace capacitor $C_{RD}$ is coupled across the series arrangement of horizontal deflection winding $L_H$ inductor $L_{LIN}$ and trace capacitor $C_s$. A second, modulator retrace capacitor $C_{RT}$ is coupled across diode D2. Coupled between the bottom plate of trace capacitor $C_s$ at a terminal 29a and ground is the series arrangement of a modulation inductance $L_m$ and a modulation capacitor $C_m$. A modulation voltage $V_m$ at a terminal 29 is supplied by the emitter electrode of an emitter follower, or buffer transistor Q2. Capacitor $C_m$ filters out a horizontal rate component voltage from voltage $V_m$.

A network 27 generates, in accordance with a vertical rate sawtooth signal $V_f$ of a vertical deflection output stage, that is not shown in the FIGURE, a parabolic voltage $V_{Pl}$ at the vertical rate. Parabolic voltage $V_{Pl}$ is AC-coupled by a capacitor C2 to a base electrode of a transistor Q3 that operates as an inverting amplifier. The amplification factor is determined by the ratio between a resistor R7 coupled to the collector and a resistor R8 coupled between the emitter of transistor Q3 and ground. The collector of transistor Q3 is coupled to the base of transistor Q2. The parabolic voltage that is coupled to terminal 29 via transistors Q3 and Q2 provides an AC component voltage $V_{m(AC)}$ of voltage $V_m$ that provides, in a well known manner, pincushion distortion correction in deflection circuit output stage 25, configured as a diode modulator.

In carrying out a feature of the invention, B+ voltage is coupled to terminal 29 of deflection circuit output stage 25 via a resistive voltage divider that includes resistors R1, R3 and R4. A terminal 31 at a junction of resistors R1, R3 and R4 is coupled to the base of a transistor Q4. The voltage contributions of a portion of B+ voltage that is determined by resistors R1, R3 and R4 and that of a voltage $V_{WA}$ that is coupled via the voltage divider formed by resistors R3 and R4 form a voltage $V_{31}$ at terminal 31. Transistor Q4, that operates as an emitter follower, couples voltage $V_{31}$, developed at terminal 31, to the base of transistor Q2 via resistor R7 to form a DC component voltage $V_{m(DC)}$ of voltage $V_m$ at terminal 29.

A variable resistor R2 and fixed resistors R5 and R6 form a voltage divider to voltage $V_{WA}$. Voltage $V_{WA}$ does not change when a change in B+ voltage occurs. A portion of voltage $V_{WA}$ is coupled via a resistor R8 to a terminal 32, that is coupled to the base of transistor Q3, to form a DC component voltage $V_{Q3b(DC)}$. Voltage $V_{Q3b(DC)}$ is coupled to the base of transistor Q2 by transistor Q3 that is coupled as an inverting amplifier. The gain of such amplifier is determined by a ratio between resistor R7 and a resistor R9 at the emitter of transistor Q3. By adjusting resistor R2, voltage $V_{m(DC)}$ at terminal 29 and, hence, the raster width may be adjusted. Thus, a variation of voltage B+ produces, via resistors R1, R3 and R4, a corresponding variation of DC voltage $V_{m(DC)}$. The contribution of B+ voltage to the level of voltage $V_{m(DC)}$ is larger than that of voltage $V_{WA}$. Therefore, a given variation in B+ voltage produces, in voltage $V_{m(DC)}$, a similar proportional variation.

Regulator 26, that generates B+ voltage from a DC, unregulated voltage $V_{in}$, receives a signal $V_{W2}$ across a secondary winding W2 of transformer T and a DC reference signal $V_{ref}$. By regulating B+ voltage, regulator 26 causes an amplitude during retrace of signal $V_{W2}$ such as, for example, the peak amplitude, to be the same, and in accordance with signal $V_{ref}$, at any scan frequency $f_H$ that is selected. The scan frequency may be selected from, for example, a range of frequencies such as between 21.8 KHz and 30 KHz. The scan frequency is established by a horizontal rate signal $V_H$ that controls the switching frequency $f_H$ of transistor Q1. When the scan frequency $f_H$ changes by a given ratio, B+ voltage will, because of the operation of regulator 26, automatically change approximately by a similar ratio for maintaining the amplitude of signal $V_{W2}$ the same.

Assume that, as a result of a change in the scan frequency, B+ voltage, that prior to the change had a value $V_{B+(1)}$, has, after the change, a value that is equal to $V_{B+(1)} \cdot (1+k)$, where k is a change fraction. Further assume that the contribution of voltage $V_{WA}$ to voltage $V_{m(DC)}$ is small relative to that of B+ voltage. It follows that DC component voltage $V_{m(DC)}$ becomes, as a result of the change in B+ voltage, equal to $V_{m(1)} \cdot (1+k)$, where $V_{m(1)}$ is the value of voltage $V_m$ prior to such change. The result is that a DC component voltage $V_{cs(DC)}$ in capacitor $C_s$ will change from a value, $(V_{B+(1)} - V_{m(1)})$, prior to such change, to a new value, $(V_{B+(1)} - V_{m(1)}) \cdot (1+k)$, after such change. Thus, the proportional change in voltage $V_{cs(DC)}$ is equal, in this case, to the proportional change in B+ voltage.

In the circuitry of the FIGURE, a change in B+ voltage, results in the same proportional change in voltage $V_{m(DC)}$. The corresponding change in voltage $V_{m(DC)}$ advantageously, causes a change in DC component voltage $V_{cs(DC)}$ of voltage $V_{cs}$ that is caused by the change in B+ voltage to be proportionally closer to the proportional change in B+ voltage. Additionally, the corresponding change in voltage $V_{m(DC)}$, caused by the change in the scan frequency, causes, advantageously, a reduction in a variation of the ratio between voltages $V_{m(DC)}$ and $V_{cs(DC)}$ that would have been greater had voltage $V_{m(DC)}$ remained constant.

Voltage $V_{m(DC)}$ controls the peak amplitude of a retrace voltage $V_{RT}$ across capacitor $C_{RT}$. Similarly, voltage $V_{cs(DC)}$ controls the peak amplitude of voltage $V_{RD}$ across capacitor $C_{RD}$.

Another advantageous aspect of the circuitry of the FIGURE is that the corresponding change in voltage $V_{m(DC)}$ reduces a variation of the ratio between voltages $V_{RD}$ and $V_{RT}$ that may be caused by the change in the selected scan frequency $f_H$. Reduction of the variation of such ratio occurs because, as explained before, variation of the ratio between voltages $V_{cs(DC)}$ and $V_{m(DC)}$ is reduced.

Voltage $V_{W2}$ that is maintained constant by regulator 26 is related to the sum of voltages $V_{RT}$ and $V_{RD}$. The ratio between voltages $V_{RD}$ and $V_{RT}$ remains relatively constant, as described before. It follows that the amplitude of voltage $V_{RD}$ will be approximately the same at each selected scan frequency $f_H$. Voltage $V_{RD}$ is related to the peak value of deflection current $i_y$ that establishes the raster width. Therefore, at each scan frequency $f_H$, the amplitude of deflection current $i_y$ will also be approximately the same. Consequently, regulator 26, that maintains the amplitude of signal $V_{W2}$ the same at each scan frequency $f_H$, directly by controlling B+ voltage, and indirectly by controlling modulator voltage $V_{m(DC)}$, will also maintain a predetermined characteristic of the raster, such as, for example, the raster width, substantially the same at each scan frequency $f_H$. Thus, the proportional change in voltage $V_{m(DC)}$, that is a correction voltage representative of B+ voltage, maintains the raster width the same at each selected scan frequency. It should be understood from the foregoing discussion that even though the change in B+ voltage, by itself, tends to compensate for the raster width changes when a change in the scan frequency occurs, without the additional corresponding change in voltage $V_{m(DC)}$, the change in B+ voltage would not have adequately maintained the raster width constant.

What is claimed:

1. A deflection apparatus for generating a deflection current in a deflection winding, said apparatus being capable of generating said deflection current at any frequency selected from a plurality of frequencies such that the width of a raster formed by said deflection current is maintained unchanged at the selected frequency, comprising:
   a source of an input signal at a frequency that is related to the selected frequency;
   a source of a supply voltage;
   means coupled to said source for varying said supply voltage to have a level that is different at correspondingly different selected scan frequencies;
   a deflection winding;
   swithching means coupled to said supply voltage and responsive to said input signal for generating said deflection current in said deflection winding;
   first and second retrace capacitance coupled in series across a pair of main current conducting terminals of said switching means for developing corresponding first and second retrace voltages;
   a modulation inductance having a terminal that is coupled at a junction between said first and second retrace capacitance;
   a source of modulating voltage coupled via said modulation inductance to said terminal of said inductance to provide East-West pincushion correction; and
   means responsive to said supply voltage for coupling to said terminal of said inductance, via said modulation inductance, a correction voltage representative of said level of said supply voltage such that varying said supply voltage causes said correction voltage also to vary in a manner that maintains the raster width the same at the different selected frequencies.

2. An apparatus according to claim 1 wherein said correction voltage controls the ratio between said first and second retrace voltages at each scan frequency.

3. An apparatus according to claim 1 further comprising a flyback transformer having a first winding for coupling said supply voltage to said switching means and a second winding for developing a third retrace voltage such that a variation of the ratio between said third retrace voltage and at least one of said first and second retrace voltages at said different selected scan frequency is maintained small by said correction voltage.

4. An apparatus according to claim 3 wherein said source of supply voltage comprises a voltage regulator, responsive to said third retrace voltage, for generating said supply voltage, in accordance with said third retrace voltage, such that the amplitude of said third retrace voltage remains approximately the same at each selected scan frequency.

5. An apparatus according to claim 1 wherein said switching means, first and second retrace capacitances and said modulation inductance form a diode modulator that provides pincushion distortion correction.

6. An apparatus according to claim 1 further comprising a trace capacitor coupled to said deflection winding for developing a trace voltage that varies in accordance with a difference between said supply voltage and said correction voltage such that a change in said supply voltage produces a corresponding change in said trace voltage that maintains the raster width the same at said different selected scan frequencies.

7. An apparatus according to claim 1 wherein said means that couples said correction voltage comprises a resistive voltage divider coupled to said supply voltage for generating said correction voltage such that, at each selected scan frequency, the ratio between said correction voltage and said supply voltage is approximately the same.

8. An apparatus according to claim 1 wherein said selected scan frequency is at a horizontal rate, and wherein said modulation voltage is at a vertical rate.

9. A deflection apparatus for generating a deflection current in a deflection winding at any frequency selected from a plurality of frequencies such that at a given selected scan frequency said deflection current is capable of forming a raster having a predetermined characteristic that tends to change with scan frequency, comprising:
   a source of an input signal at a frequency that is related to the selected scan frequency;
   a deflection winding;
   a deflection circuit responsive to said input signal and coupled to said deflection winding for producing in said deflection winding said deflection current at the selected scan frequency;
   a source of a supply voltage coupled to said deflection circuit and having a level that, in accordance with said frequency of said input signal, is different at correspondingly different selected scan frequencies, such that a change in said supply voltage caused by a change in the selected scan frequency tends to reduce a variation in said predetermined characteristic of said raster that is caused by said change in the selected scan frequency; and
   means responsive to said supply voltage for generating in accordance with said level of said supply voltage a raster control voltage having a level that is different at said correspondingly different scan frequencies, such that a change in said raster control voltage is caused by said change in the selected scan frequency, said raster control voltage being coupled to said deflection circuit to develop in said deflection circuit a deflection current control voltage that is related to the difference between said supply and raster control voltages, such that a change in said level of said supply voltage, that defines a first proportional change relative to said supply voltage, and that is caused by said change in the selected scan frequency, causes a concurrent change in said deflection current control voltage that defines a second proportional change relative to said deflection control voltage, wherein said change in said raster control voltage causes said second proportional change to be closer to said first proportional change absent said change in said raster control voltage for further reducing said variation in said predetermined characteristic of said raster.

10. An apparatus according to claim 9 wherein said predetermined characteristic of said raster is the raster width and wherein said deflection current control voltage controls the amplitude of said deflection current such that the amplitude of said deflection current and the corresponding width of said raster formed by said deflection current remain substantially the same at each selected scan frequency.

11. An apparatus according to claim 10 wherein said deflection current control voltage developing means comprises a trace capacitance coupled to said deflection winding for developing said deflection current control voltage between said pair of terminals of said trace capacitance.

12. An apparatus according to claim 10 wherein said deflection circuit further comprises a diode modulator that provides, in accordance with a modulation voltage, pincushion distortion correction and wherein both said raster control and modulation voltages are coupled to a terminal of said diode modulator.

13. An apparatus according to claim 10 wherein said deflection circuit further comprises means coupled to said deflection winding for developing a retrace voltage, during retrace, and wherein said apparatus further comprises a voltage regulator responsive to said retrace voltage for generating said supply voltage that is regulated, in accordance with said retrace voltage, so as to maintain the width of said raster unchanged at each selected scan frequency.

14. An apparatus according to claim 13 wherein said deflection circuit further comprises switching means responsive to said input signal and coupled to said supply voltage and wherein said retrace voltage developing means comprises a flyback transformer having a first winding coupled between said switching means and said supply voltage and a second winding for developing said retrace voltage in said second winding.

15. An apparatus according to claim 10 further comprising a voltage regulator for generating said supply voltage, wherein said deflection circuit further comprises a diode modulator that includes first and second retrace capacitances and wherein said supply voltage is regulated in said regulator in accordance with the sum of the voltages in said first and second retrace capacitances.

16. An apparatus according to claim 9 wherein said deflection circuit comprises switching means responsive to said input signal and coupled to said deflection winding for generating said deflection current in said deflection winding, a first winding of a flyback transformer for coupling said supply voltage to said switching means, first and second retrace capacitances coupled in series across a pair of main current conducting terminals of said switching means for developing corresponding retrace voltages in said first and second retrace capacitances and for developing a third retrace voltage in a second winding of said transformer that is indicative of the sum of said retrace voltages in said first and second retrace capacitances and wherein said raster control voltage generating means reduces a variation in the ratio between said third retrace voltage and at least one of said retrace voltages in said first and second retrace capacitances caused by said change in the selected scan frequency.

17. An apparatus according to claim 9 wherein said deflection circuit comprises switching means responsive to said input signal and coupled to said supply voltage and to said deflection winding, series coupled first and second retrace capacitances that are coupled across said switching means, a modulation inductance having a first terminal that is coupled at a junction terminal between said first and second retrace capacitances and a second terminal that is coupled to said raster control voltage, wherein said raster control voltage that is coupled to said deflection circuit via said modulation inductance, reduces a variation of a ratio between a retrace voltage in said first retrace capacitance and a retrace voltage in said second retrace capacitance that is caused by said change in the selected scan frequency.

18. An apparatus according to claim 17 further comprising a source of a vertical rate parabolic voltage that is coupled to said second terminal of said modulation inductance to provide pincushion distortion correction.

19. An apparatus according to claim 9 wherein said raster control voltage generating means causes, in accordance with a given variation in said supply voltage, approximately the same proportional variation in said raster control voltage.

20. An apparatus according to claim 9 wherein said raster control voltage generating means comprises a resistive voltage divider having an input terminal that is coupled to said supply voltage and wherein said raster control voltage comprises a portion of said supply voltage that is generated at an output terminal of said resistive voltage divider.

21. An apparatus according to claim 9 further comprising a resistive voltage divider coupled to said supply voltage and to a first voltage for generating a second voltage that is representative of a sum of corresponding portions thereof, respectively, wherein said raster control voltage generating means couples said second voltage to a terminal of said deflection circuit to form thereat said raster control voltage and wherein said first voltage remains unchanged when said change in the selected scan frequency occurs.

* * * * *